United States Patent [19]

Baertsch et al.

[11] 4,097,886
[45] Jun. 27, 1978

[54] SPLIT ELECTRODE STRUCTURE FOR SEMICONDUCTOR DEVICES

[75] Inventors: Richard D. Baertsch, Scotia; Jerome J. Tiemann, Schenectady, both of N.Y.

[73] Assignee: General Electric Company, Schenectady, N.Y.

[21] Appl. No.: 735,024

[22] Filed: Oct. 22, 1976

[51] Int. Cl.² .................. H01L 29/78; G11C 19/28; H03H 7/28
[52] U.S. Cl. ................ 357/24; 307/221 D; 333/70 T
[58] Field of Search ............ 357/24; 307/221 D; 333/70 T

[56] References Cited

U.S. PATENT DOCUMENTS

| | | | |
|---|---|---|---|
| 3,819,958 | 6/1974 | Gosney | 333/70 T |
| 4,005,377 | 1/1977 | Engeler | 357/24 |

OTHER PUBLICATIONS

Buss et al. "Transversal Filtering Using Charge-Transfer Devices" IEEE J. Solid-State Circuits vol. SC-8 (4/73), pp. 138–146.

*Primary Examiner*—William D. Larkins
*Assistant Examiner*—Gene M. Munson
*Attorney, Agent, or Firm*—J. J. Zaskalicky; J. T. Cohen; M. Snyder

[57] ABSTRACT

Geometries suitable for split or paired electrode structures of small effective dimensions which are readily implementable with a high degree of accuracy are provided.

2 Claims, 5 Drawing Figures

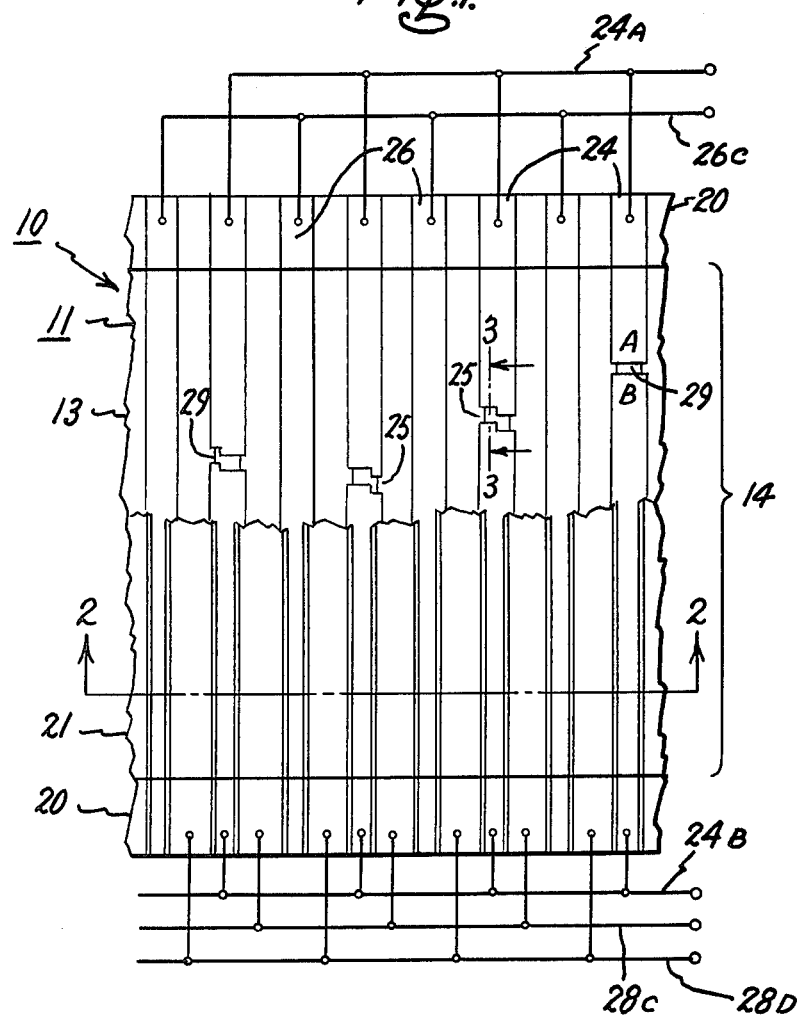
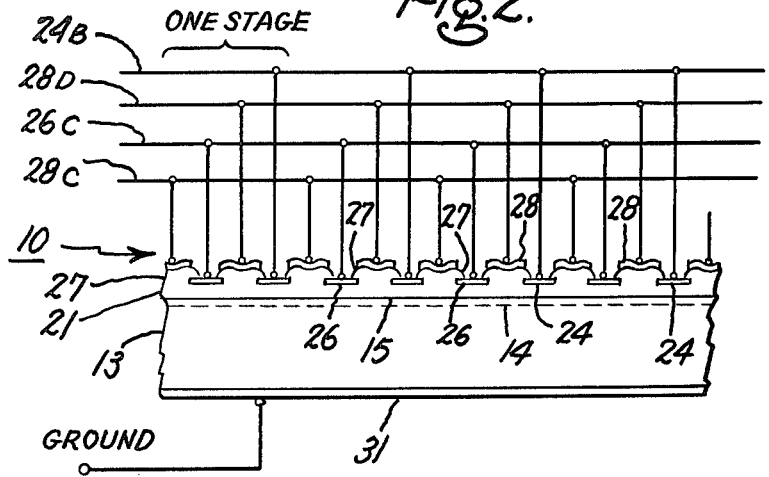

SPLIT ELECTRODE STRUCTURE FOR SEMICONDUCTOR DEVICES

The present invention relates in general to semiconductor devices with split electrodes and in particular to charge transfer transversal filters in which semiconductor devices with split electrodes are utilized to provide tap weight coefficients in the various stages thereof.

A charge transfer transversal filter comprises a serial organization of N stages of closely coupled MOS (Metal-Oxide-Semiconductor) capacitors. Charge packets representing sequential samples of an analog signal are serially inserted into the filter and are clocked at a rate $f_c = 1/T_c$ per sec, where $T_c$ is the period of the sampling, along the N stages of the filter. A charge packet emerges from the last stage $NT_c$ seconds after introduction or insertion into the filter. The filter includes means for non-destructively measuring and weighting the signal samples at each of the stages. Tap weights are implemented in each of the stages by splitting the commonly phased electrodes of the capacitors of the stages into a A side or part and a B side or part. The A sides of the electrodes are connected together and to a first commonly phased line, and also the B sides of the electrodes are connected together and to a second commonly phased line. These two lines are connected to the input terminals of a differential amplifier in addition to being connected to the phase generation means. This amplifier implements the sum over all stages of the differences in the induced charges in the A and B portions of the split electrodes. Thus, an electrode with a split at the center corresponds to a tap weight of zero. An electrode split such that the active portion of the electrode is connected to only the first (A side) commonly phase line corresponds to a tap weight of +1. An electrode split such that the active portion of the electrode is connected to only the second (B side) commonly phased line corresponds to a tap weight of −1. An electrode split at an intermediate point would provide a corresponding intermediate tap weight. Thus, a surface charge transversal filter, such as described above, generates an output signal $S_{out}(t)$ which is the convolution of N samples of an input signal $S_{in}(t)$ with a set of N weighting factors ($W_n$) referred to as tap weights. The foregoing statement may be expressed mathematically as follows:

$$S_{out}(t) = \sum_{n=1}^{N} W_n S_{in}(t - nT_c). \quad (1)$$

The frequency response of the filter is determined by the choice of the N tap weights $W_n (n = 1, N)$. The accuracy with which the frequency response can be realized is determined by the accuracy with which the tap weights are implemented. The tap weights are calculated from the specification of the desired frequency response and are often calculated to at least six significant figures, that is, at least to within one part in 100,000 parts. The accuracy of implementing the tap weights of the filter is dependent upon the accuracy with which the masks for forming the split electrodes of the filter are made. Normally, the art work for the masks is generated at ten times final size and the actual exposure of the photographic media is done with a pattern generator, such as Mann pattern generator Model 1600 made by D. W. Mann Co. of Burlington, Mass., by flashing an aperture. With such a pattern generator the size and location of the pattern which is flashed is limited to discrete steps. After a reduction of 10 times, the minimum discrete step is 0.025 mil and the minimum aperture is 0.05 mil. Thus, with parts of an electrode which are of a rectangular outline, the number of discrete steps providable in an electrode of a given width is 40 times the width of electrode in mils. Accordingly, if the width of an electrode is 30 mils then the tap weight resolution would be one part in 1200. Thus, the calculated tap weights calculated to at least six significant figures must be rounded off to the nearest one of 1200 discrete tap weight values available. Such a round off causes the frequency response of the filter to deviate significantly from the original design and thus is a limitation in the performance that can be achieved with charged transfer device split electrode filters.

One approach to increasing tap weight accuracy is to increase the width of the split electrode. For example, if the width of the electrode were increased from 30 mils to 60 mils, then 2400 discrete steps would be available. However, increasing the width of the split electrode means that the filter chip would become correspondingly larger and yields of chips would suffer. Another approach is to form the art work at 20 times actual size and utilize a 20 to 1 reduction to form the final mask. Since the minimum step size of the pattern generator is one-quarter mil, a 20 times reduction in the art work generated by the aforementioned pattern generator would also provide 2400 discrete steps. However, increasing the reduction in the art work generated by the pattern generator is not particularly desirable since the 10 to 1 reduction is usually chosen to provide the best optical resolution.

The present invention is directed to the provision of split electrode structures for use in charge transfer devices in which the relative areas of the two portions of each of the split electrodes are provided with a high degree of precision without the disadvantages of prior art approaches for obtaining increased precision of tap weight implementation.

An object of the present invention is to provide improvements in split electrode semiconductor devices.

Another object of the present invention is to provide split electrodes in charge transfer devices which enables practical implementation with much greater precision than heretofore possible.

In carrying out the present invention in an illustrative embodiment thereof, there is provided a substrate of semiconductor material including a channel portion adjacent a major surface thereof. A group of electrodes are provided insulatingly overlying the channel portion and orthogonal to the length thereof to form a plurality of stages of a charge transfer device, each stage of the device including a respective one of the electrodes. Each of the electrodes have the same length and the same area. Each of the electrodes have a split along the length dimension thereof dividing the electrode into a first part and a second part. Each of the ratios of the areas of the first part to the second part of an electrode is set to a respective predetermined value. The area of each of the parts of the electrodes is resolvable into the area of a respective integral number of elements and a remainder portion smaller in area than the area of an element. An element is a rectangle having one side equal to the length of the electrodes and an adjacent side equal to a predetermined minimum linear dimension. The area of each of the remainder portions is resolvable into the area of a respective integral number of subelements. A subelement is a square whose sides are the smallest resolvable length. Each pair of remainder portions of an electrode is located adjacent the split thereof. The sum of the areas of each of remainder portions of a respective electrode is equal to the area of an element. Thus, each part of an electrode can be provided with any one of a plurality of consecutive discrete values of area from zero to the total area of an electrode in uniform steps equal to the area of a subelement.

The features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIG. 1 shows a plan view of a charge transfer transversal filter embodying the present invention.

FIG. 2 is a sectional view of FIG. 1 taken along sectional lines 2—2 of FIG. 1.

Figure 3:
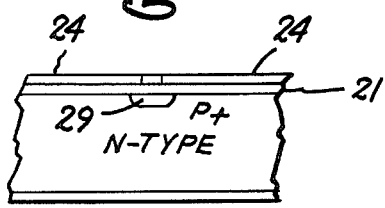
FIG. 3 is a section view of FIG. 1 taken along sectional lines 3—3 of FIG. 1.

Reference is now made to FIGS. 1 and 2 which show a portion of a transversal filter 10 including a charge coupled shift register 11 with split electrodes in accordance with the present invention. The shift register 11 is formed on a substrate 13 of N-type conductivity silicon semiconductor material which has a channel portion 14 of uniform width adjacent a major surface 15 of the substrate. Overlying the major surface of the substrate 13 is a thick insulating member 20 of silicon dioxide having a thin portion 21 of generally rectangular outline and lying in registry with the channel portion 14 of the substrate. A first plurality of electrodes 24 are provided on the insulating member 20 overlying the thin portion 21 thereof and orthogonal to the length thereof. Each of the electrodes 24 is of uniform length in the direction of the length of the semiconductor channel portion 14 and each of the electrodes 24 extends across the thin insulating portion 21 of the insulating member as well as over the bordering thick insulation portions of the insulating member 20. Each of the electrodes 24 of the first plurality has a split or gap 25 across the short or length dimension thereof over the channel portion and divides the electrode into a first or A part and a second or B part.

The gap or split 25 in each of the electrodes 24 is small to allow the depletion regions or potential wells under the A and B parts to be coupled together efficiently to enable charge transferred to two potential wells under each electrode 24 to equilibrate, i.e., to enable, the charge density under the A and B parts of the electrode to be identical. Equilibration is enhanced by the inclusion of a plurality of regions 29 of P-type conductivity, each underlying a respective one of splits or gaps 25 as more fully described and claimed in copending patent application Ser. No. 609,414, filed Sept. 2, 1975, now U.S. Pat. No. 4,005,377, and assigned to the assignee of the present invention and which is incorporated herein by reference thereto. Typically the electrodes 24 have a length (dimension in the direction of charge transfer in the channel 14) of about 0.6 mil and a gap 25 of about 0.2 mil between part A and part B of electrode 24. Conveniently, the width of the electrodes may be 30 mils. The P-region 29 may have a conductivity of the order of 100 ohms per square.

In the aforementioned patent application Ser. No. 609,414, the splits are of uniform geometry and the location thereof from electrode to electrode varies to provide the desired weighting in each of the stages. In accordance with the present invention, in addition to varying the location of the split along the width dimension of an electrode, the geometric outline of the split is varied to provide weighting of the electrodes and hence the stages of the transversal filter to a much higher degree of accuracy in a manner to be more fully described in connection with the electrode structures of FIGS. 4 and 5.

A second plurality of electrodes 26 which are unsplit are provided on the insulating member 20 overlying the thin portion 21 thereof and orthogonal to the length thereof. Each of the electrodes 26 is of uniform length in the direction of the length of the channel portion 14 and equal to the uniform length of each of the electrodes 24 of the first plurality. Each of the electrodes 26 of the second plurality are spaced between adjacent electrodes 24 of the first plurality and each extends completely over the thin insulating portion of the insulating member 20 as well as the bordering thick insulation portions of the insulating member 20. An insulating layer 27 is provided over the electrodes 24 and 26. A plurality of transfer electrodes 28 are provided over the insulating layer 27, each of the transfer electrodes being insulatingly spaced between adjacent electrodes of the first and second pluralities and overlying the adjacent members thereof. Each of the transfer electrodes 28 is of substantially uniform extent in the direction of the length of the channel portion 14 and each transfer electrode 28 extends entirely over the thin insulating portion 21 of the insulating member 20 as well as the bordering thick insulating portions thereof.

All of the A or first parts of the electrodes 24 of the first plurality are connected to a common line 24A. All of the B or second parts of the electrodes 24 of the first plurality are connected to a common line 24B. All of the second plurality of electrodes 26 are connected to a common line 26C. All of the transfer electrodes 28 immediately preceding the split electrodes 24, that is, on the input side thereof, are connected to a common line 28D. All of the transfer electrodes 28 located on the output side of the conductor members of the first plurality are connected to a common line 28C. A conductive layer 31 of a suitable material such as aluminum is bonded to the lower surface of the substrate 13 to provide a ground connection for the filter.

Figure 4:
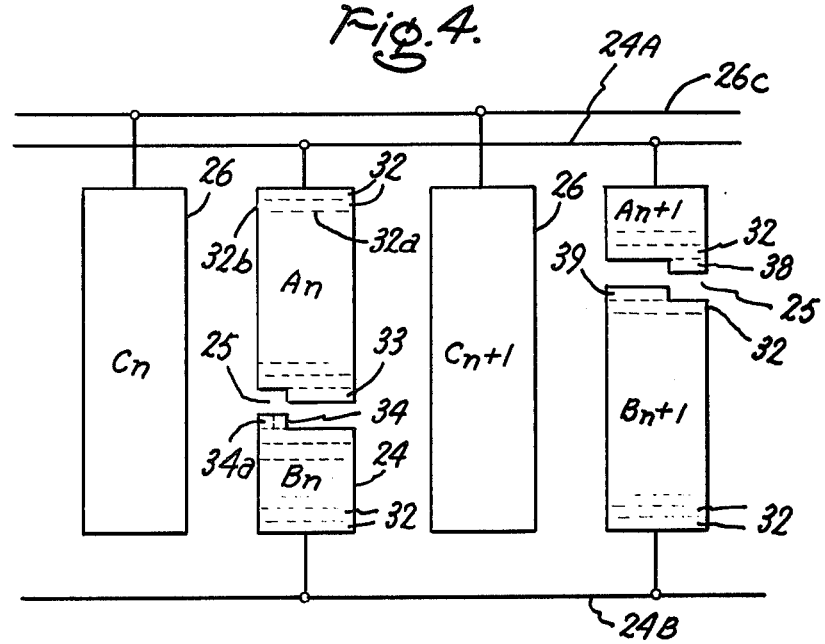
FIG. 4 is a diagram of some of the storage and transfer electrodes of the embodiment of FIG. 1 showing one mode of obtaining improved tap weight resolution in accordance with the present invention.

Reference is now made to FIG. 4 which shows parts of two stages of the transversal filter structure of FIGS. 1-3 in which identical elements are identically denoted. In this figure are shown two successive electrodes 24 with splits in them and two successive electrodes 26 without splits in them. The weighting of an electrode is determined by the relative areas of the A and B parts of the electrode. The ratio of the areas of the A and B parts of the $n^{th}$ split electrode are related to the tap weight $W_n$ as follows:

$$\frac{\text{Area of } A_n}{\text{Area of } B_n} = \frac{\frac{1}{2}(1 + W_n)}{\frac{1}{2}(1 - W_n)}, \quad (1)$$

where tap weights have been normalized so that $-1 \leq W_n \leq +1$. Thus, with the split at the center of the electrode 24 and with the area of part $A_n$ equal to area of part $B_n$, the tap weight $W_n$ would be zero. With no split and the electrode 24 connected to the line 24b, that is, with area of $A_n$ equal to zero, $W_n$ equals $-1$. Conversely, with the electrode 24 connected to the line 24a, that is, with the area of $B_n$ equal to 0, $W_n$ equals $+1$.

To obtain a desired output response from the filter, the weighting $W_n$ is present in some predetermined relationship with respect to the stage number $n$, that is, $W_n = F(n)$. For example, in a matched low pass filter the weighting as a function of stage number is as follows:

$$W_n = K\left[\frac{\sin\left\{\frac{2\pi}{M}\left[n - \frac{(N-1)}{2}\right]\right\}}{\frac{2\pi}{M}\left[n - \frac{(N-1)}{2}\right]}\right], \quad (2)$$

where N is the number of taps or stages, M is a constant which relates to the cutoff frequency of the filter, and K is a constant of proportionality. For example, to provide a low pass filter of the desired cutoff frequency and the desired rejection beyond the cutoff frequency, a suitable number of stages N are selected. The number M is set by the desired cutoff frequency. The tap weights $W_n$ are then calculated for each of the stages by simply substituting the stage number for n and determining $W_n$. $W_n$ is usually calculated out to at least six significant figures. To complete the design of the filter, it is then simply necessary to proportion the areas of the A and B parts of each of the split electrodes of the various stages in accordance with the tap weight thereof, that is, it is simply necessary to substitute the tap weights into equation 1 to arrive at the ratio of the areas of the A and B parts of the split electrodes. In prior art split electrode structure such as described in the aforementioned patent application Ser. No. 609,414, the geometry of the split for each of the split electrodes is identical and the weighting is achieved for each stage by varying the location of the split along the width dimension thereof. With such an electrode structure the minimum discrete step change in area of a part of an electrode is dependent upon the minimum linear step in the width direction producible in the mask used for making the electrodes. As pointed out above, the minimum increment of electrode area producible in the electrode mask in the width direction using the width direction alone for the commonly used procedure is 0.025 mil and for a mask design in which the total electrode width of A and B parts is of the order of 30 mils, only 1200 discrete values are obtainable in the A or B parts of an electrode. Such resolution is considerably lower than the variations in electrode area introduced by the processing used for fabricating the electrodes in the devices, and is also considerably lower than the quantization necessary to accurately implement the tap weights to obtain the desired performance in the filter.

In accordance with the present invention, electrode structures are provided which enable full advantage to be taken of mask making procedures and apparatus to provide a much larger number of consecutive discrete values of area from zero to the total area of an electrode than heretofore possible without requiring an increase in the area of an electrode or changing the electrode geometry. Thus full advantage of the ultimate filtering capabilities of charge transfer transversal filters is made possible.

One mode of achieving this result will now be described in connection with FIG. 4. The area of $A_n$ of the upper part of electrode 24 ($n^{th}$ electrode) is resolvable into a plurality of integral number of unit areas or elements 32 and a remainder portion 33 smaller in area than the area of an element and located adjacent the split 25 in the electrode. Similarly the area of $B_n$ or lower part of the electrode 24 is resolvable into another integral number of elements 32 and another remainder portion 34 smaller in area than the area of an element and also located adjacent the split 25 of the electrode. As shown, an element 32 or a unit area is a rectangle having one side 32a equal to the length of the electrode 24 and an adjacent side 32b equal to a predetermined minimum linear dimension corresponding to the minimum linear increment or decrement in the width direction producible in the mask for making the electrodes. As the minimum linear dimension 32b is substantially smaller than the length of an electrode 24, the unit area or element may be subdivided into a number of subelements, a subelement being the smallest resolvable area of an element. In this case the smallest resolvable area would be a square with a side equal to the minimum linear dimension. Such a square is shown at 34a constituting one-half of the remainder portion 34 of the lower part $B_n$ of the electrode. Thus, each part of an electrode can be provided with any of P times Q consecutive discrete values of area from zero to the total area of an electrode, where P equals the number of elements in an electrode and Q equals the number of such subelements in an element. The other split electrode 24 of FIG. 4 is shown with remainder portions 38 and 39 in the upper part and the lower part of different values.

Figure 5:
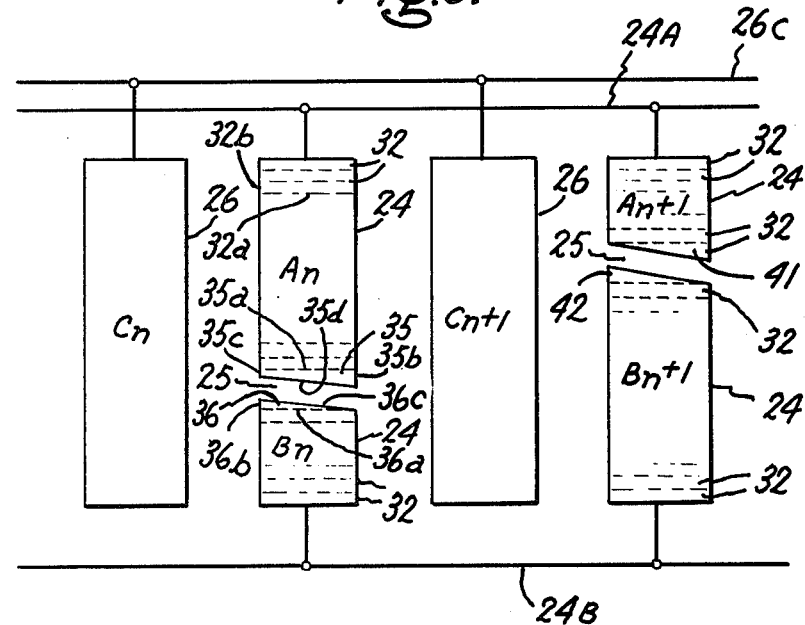
FIG. 5 is another diagram of some of the storage and transfer electrodes of the embodiment of FIG. 1 showing another mode of obtaining improved tap weight resolution in accordance with the present invention.

Another mode of achieving tap weight accuracy in transversal filters is illustrated in FIG. 5 which is similar to FIG. 4 and in which identical elements are identically designated. The upper or A part of the electrode 24 is resolved into a plurality of elements 32 and a remainder portion 35 and similarly the lower or B part of the electrode is resolved into a plurality of elements 32 and a remainder portion 36. In this case, the angular control feature of the pattern generator is used to generate interpolated values. Note that the area of one rectangular element 32 is equal to L times D, where L represents the length of side 32a and D represents the height of side 32b, the minimum linear dimension. Note that the minimal right triangular element which can replace the rectangular element 32 is one which has a base equal to L and a height equal to 2D. Note that the angle $\theta$ which the hypotenuse makes with the base of this triangle can be expressed as follows:

$$\theta = \arctan\left(\frac{2D}{L}\right)$$

Accordingly, as the Mann pattern generator Model 1600, referred to above, can step angles in minimal increments of one degree, the number of interpolation steps which can be provided is equal to the number of whole degrees in the angle θ. Since θ is typically of the order of 10°, this method produces a quantization error of approximately one-tenth of the area of one rectangular element. The ratio L/D is chosen to be close to an integer and preferably equal to the integer. In any case the number of whole degrees can be taken as the quantity Q, referred to in the previous example of FIG. 4. Thus, remainder portion 36 is a triangle having a base 36a, a height 36b and a hypotenuse 36c with arc tangent of the length of 36b to the length 36a being equal to a whole number of degrees. To keep the total area of electrode 24 constant, a remainder area is substracted from the upper or A side of the electrode, the shape of which is exactly the same as that which is added to the lower of B side or the electrode. This results in a trapezoidal remainder portion 35 bounded by rectilinear segments 35a, 35b and 35c and a line 35d which is parallel to the hypotemuse 36c of triangle 36. The other split electrode of FIG. 5 is shown with remainder portions 41 and 42 of equal area and both right triangles.

The transversal filter of FIGS. 1–3 is identical to the transversal filter of FIGS. 1–3 of the aforementioned patent application Ser. No. 609,414, except for the manner of proportioning the electrodes 24 to provide the desired tap weights. The manner of connecting the filter of FIGS. 1–3 to input and output circuits is identical to the manner of connection of the filter of the aforementioned patent application to input and output circuits. The filters of the aforementioned patent application and this patent application operate in essentially the same manner. However, in the operation of the transversal filter of this application, improved response is obtained therefrom as the tap weights are provided with much greater accuracy.

While the present invention has been shown and described in connection with a charge transfer transversal filter device it is readily apparent that it is not limited to such devices, but is applicable to other such devices using split or paired electrodes. For example, the present invention is applicable to split electrode devices in which the split electrodes are split over a thick oxide portion of the device and the area of a split electrode is defined by the area thereof lying over a thin oxide portion of the device. In this case the boundaries between the thick and thin oxide portions could be provided by masks produced in accordance with the procedures described above.

While the invention has been described in specific embodiments it will be appreciated that modifications, such as those described above, may be made by those skilled in the art, and it is intended by the appended claims to cover all such modifications and changes as fall within the true spirit and scope of the invention.

What we claim as new and desire to secure by Letters Patent of the United States is:

1. A semiconductor device comprising
a substrate of semiconductor material including an active channel portion of generally rectangular outline having a length and a width dimension located adjacent a major surface thereof,
means for transferring charge carriers along the length of said channel portion, and two potential barriers to the transfer of charge carriers in a direction orthogonal to the length of said channel portion which form two side bounds of said channel portion and thereby define said width dimension of said channel portion,
said means for transferring charge carriers including potentials applied to a group of electrodes insulatingly overlying said channel portion and orthogonal to the length dimension thereof, each of said electrodes being of the same length measured along the length dimension of said channel portion,
said electrodes forming with said substrate a plurality of stages of a semiconductor device, each stage of said device including a respective one of said electrodes, each of said electrodes having the same area over the extent of said channel portion, each of said electrodes having a split along the length dimension thereof dividing the electrode into a first part and a second part, each of the ratios of the area of the first part to the second part of an electrode being set to a respective predetermined value,
the area of each of said parts of said electrodes resolvable into the area of a respective integral number of elements and a remainder portion smaller in area than the area of an element, an element being a rectangle having one side equal to the length of said electrodes and an adjacent side equal to a predetermined minimum linear dimension,
the area of each of said remainder portions resolvable into the area of a respective integral number of subelements, a subelement being a square having a side equal to said predetermined minimum linear dimension,
each pair of remainder portions of an electrode being located adjacent the split thereof, the sum of the areas of each pair of remainder portions of a respective electrode being fixed and less than or equal to the area of an element,
some of said electrodes including a remainder portion having an area less than the area of an element,
a first-conductive line connected to the first parts of said electrodes,
a second conductive line connected to the second parts of said electrodes,
whereby each part of an electrode can be provided with any of PQ consecutive discrete values of area from zero to the total area of an electrode, where P equals the number of elements in an electrode and Q equals the number of subelements in an element.

2. A semiconductor device comprising
a substrate of semiconductor material including an active channel portion of generally rectangular outline having a length and width dimension located adjacent a major surface thereof,
means for transferring charge carriers along the length of said channel portion, and two potential barriers to the transfer of charge carriers in a direction orthogonal to the length of said channel portion which form two side bounds of said channel portion and thereby define said width dimension of said channel portion,
said means for transferring charge carriers including potentials applied to a group of electrodes insulatingly overlying said channel portion and orthogonal to the length dimension thereof, each of said electrodes being of the same length measured along the length dimension of said active channel portion,
said electrodes forming with said substrate a plurality of stages of a semiconductor device, each stage of said device including a respective one of said electrodes, each of said electrodes having the same area over the extent of said channel portion, each of said electrodes having a split along the length dimension thereof dividing the electrode into a first part and a second part, each of the ratios of the area of the first part to the second part of an electrode being set to a respective predetermined value, the area of each of said parts of said electrodes resolvable into the area of a respective integral number of elements and a remainder portion smaller in area than the area of an element, an element being a rectangle having one side equal to the length of said electrodes and an adjacent side equal to a predetermined minimun linear dimension, one remaider portion being a right triangle and the other remainder portion of an electrode being a trapezoid, the area of each of said remainder portions resolvable into the area of a respective integral number of subelements, a subelement being a triangle having a pair of adjacent sides spaced apart by a predetermined minimum angle, the intersection of said sides being located on one of the pair of edges of an electrode which are parallel to the width dimension thereof and the other ends of said sides being located on the other of said pair of edges of said electrode, each pair of remainder portions of an electrode being located adjacent the split thereof, the sum of the areas of each pair of remainder portions of a respective electrode being equal to twice the area of an element, some of said electrodes including a remainder portion having an area less than the area of an element, a first conductive line connected to the first parts of said electrodes, a second conductive line connected to the second parts of said electrodes, whereby each part of an electrode can be provided with any of PQ consecutive discrete values of area from zero to the total area of an electrode, where P equals the number of elements in an electrode and Q equals the number of subelements in an element,

* * * * *